(12) United States Patent
Mun et al.

(10) Patent No.: US 7,309,683 B2
(45) Date of Patent: Dec. 18, 2007

(54) CLEANING COMPOSITION AND METHOD OF CLEANING A SEMICONDUCTOR DEVICE USING THE SAME

(75) Inventors: Chang-Sup Mun, Suwon-si (KR); Chang-Ki Hong, Sungnam-si (KR); Sang-Jun Choi, Seoul (KR); Woo-Sung Han, Gangam-gu (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 284 days.

(21) Appl. No.: 11/038,585

(22) Filed: Jan. 19, 2005

(65) Prior Publication Data

US 2005/0170981 A1 Aug. 4, 2005

(30) Foreign Application Priority Data

Jan. 20, 2004 (KR) ............... 10-2004-0004319

(51) Int. Cl.
*C11D 1/12* (2006.01)
(52) U.S. Cl. ............... 510/175; 510/176; 134/3
(58) Field of Classification Search ............... None
See application file for complete search history.

(56) References Cited

U.S. PATENT DOCUMENTS

| | | | |
|---|---|---|---|
| 5,750,031 A * | 5/1998 | Rahman et al. ............ 210/681 |
| 5,968,539 A | 10/1999 | Beerse et al. |
| 6,136,514 A * | 10/2000 | Phan et al. ............ 430/327 |
| 6,383,240 B1 * | 5/2002 | Nishimoto et al. ............ 51/307 |
| 6,451,510 B1 * | 9/2002 | Messick et al. ............ 430/311 |
| 6,554,912 B2 | 4/2003 | Sahbari ............ 134/26 |
| 6,559,056 B2 * | 5/2003 | Hattori et al. ............ 438/693 |
| 6,773,464 B2 * | 8/2004 | Slusarewicz ............ 8/405 |

FOREIGN PATENT DOCUMENTS

| JP | 4124668 | 4/1992 |
|---|---|---|
| JP | 2001-316858 | 11/2001 |
| KR | 2003 0019145 | 3/2006 |
| WO | WO 01/97268 | 12/2001 |
| WO | WO 03006598 | 1/2003 |

\* cited by examiner

*Primary Examiner*—Gregory Webb
(74) *Attorney, Agent, or Firm*—F. Chau & Associates, LLC

(57) ABSTRACT

A cleaning composition comprises an alkali solution, pure water, and a surfactant represented by the following chemical formula: $R1\text{-}OSO_3\text{---}HA^+$ wherein R1 is one selected from a group consisting of a butyl group, an isobutyl group, an isooctyl group, a nonyl phenyl group, an octyl phenyl group, a decyl group, a tridecyl group, a lauryl group, a myristyl group, a cetyl group, a stearyl group, an oleyl group, a licenoleyl group and a behnyl group, and A is one selected from a group consisting of ammonia, ethanol amine, diethanol amine and triethanol amine.

12 Claims, 5 Drawing Sheets

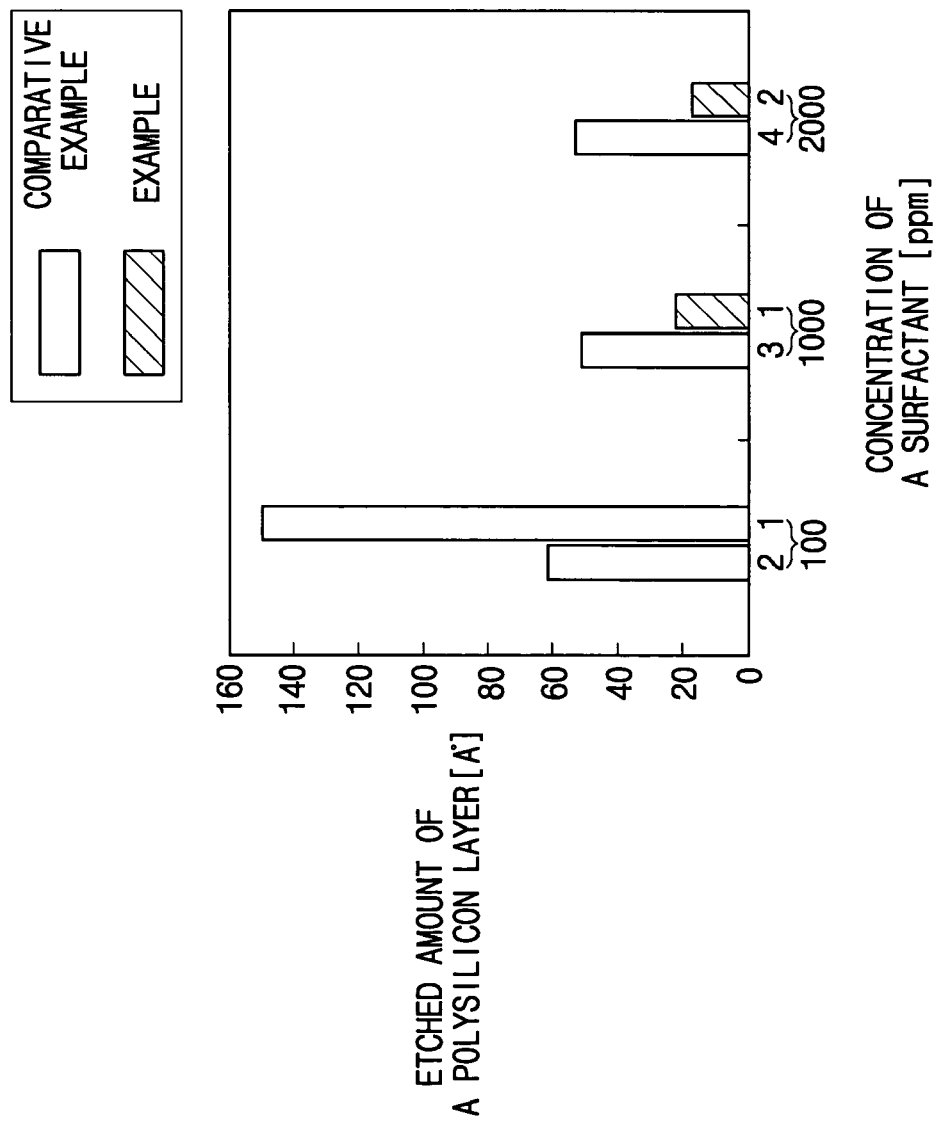

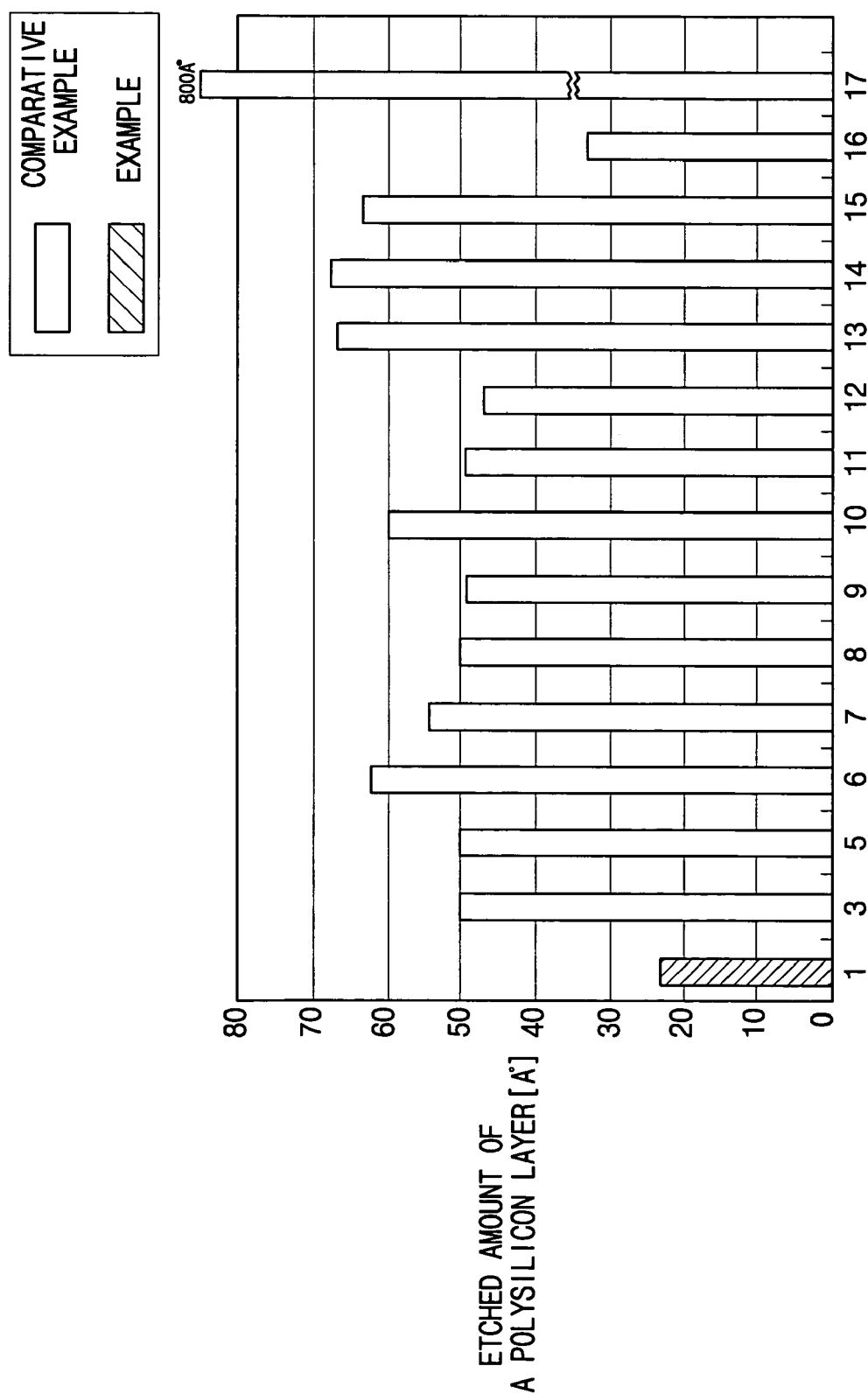

CLEANING COMPOSITION AND METHOD OF CLEANING A SEMICONDUCTOR DEVICE USING THE SAME

CROSS REFERENCE TO RELATED APPLICATION

This application claims priority to Korean Patent Application No. 2004-4319 filed on Jan. 20, 2004, which is incorporated herein by reference in its entirety.

BACKGROUND

1. Technical Field

The present disclosure relates to a cleaning composition and a method of cleaning a semiconductor device comprising the cleaning composition, and more particularly, to a cleaning composition that reduces damage to a structure of polysilicon and metal corrosion of a semiconductor device, and a method of cleaning the semiconductor device comprising the cleaning composition.

2. Discussion of Related Art

Highly integrated semiconductor devices having rapid response speed are generally used in information processing apparatuses. Technology of manufacturing the highly integrated semiconductor devices has been developed to improve such as an integration degree, reliability, and a response speed of the semiconductor device.

As patterns of the semiconductor device become small, the resistance thereof increases, and efficiency and reliability of the semiconductor device decrease. To overcome this problem, a metal typically used in the back end of line (BEOL) is employed in the front end of line (FEOL) as a substitute for polysilicon or tungsten silicide (WSix). For example, tungsten (W) has a lower resistivity and better gap filling characteristics than conventional metals. Thus, tungsten (W) is generally used as a metal wiring material instead of aluminum (Al).

The semiconductor device needs to be cleaned to remove particles, metal compounds and/or organic compound generated in the semiconductor manufacturing process, thereby improving the reliability of the semiconductor device. For example, a RCA cleaning method (developed by RCA Corp. in U.S.A.) has been used for cleaning the semiconductor device. In the RCA cleaning method, strong alkaline standard cleaning 1 (SC1) that is a mixture of ammonium hydroxide ($NH_4OH$), hydrogen peroxide ($H_2O_2$) and deionized water can be used. Alternatively, strong acid sulfuric peroxide mixture (SPM) that is a mixture of sulfuric acid ($H_2SO_4$) and hydrogen peroxide ($H_2O_2$) may be used in the RCA cleaning method.

The strong alkaline cleaning solution or the strong acid cleaning solution may cause metal corrosion in the front end of line (FEOL). For examples, when the tungsten structure is cleaned using the SC1 cleaning solution or the SPM cleaning solution, hydrogen peroxide in the cleaning solutions corrodes tungsten in the tungsten structure. Thus, when the tungsten structure of the semiconductor device is exposed, the above-mentioned cleaning solution may not be used for the semiconductor device.

To overcome the above-mentioned problem, a cleaning solution including a reducing agent, a dispersing agent, a corrosion inhibitor, a chelating agent and an organic acid is disclosed in Korean Patent Laid Open Publication No. 2003-7969. An anionic surfactant is used as the dispersing agent. Benzotriazole derivative for reducing the corrosion of copper is used as the corrosion inhibitor. Using the cleaning solution, minute particles and metal impurities may be effectively removed from a semiconductor device, and a metal wiring of the semiconductor device may be less corroded.

A metallic acid cleaning solution including at least one anionic surfactant, as a corrosion inhibitor, and an organic sulfuric compound is disclosed in Japanese Patent Laid Open Publication No. 2001-316858. With the metallic acid cleaning solution, metal corrosion may be reduced, and oxide residues absorbed on a metal surface may be removed from a semiconductor device.

Further, a cleaning agent that may reduce corrosion of a metal layer and damage to a dielectric layer is disclosed in U.S. Pat. No. 6,554,912. The cleaning agent includes polyol compound, fluoric compound, an additive, a corrosion inhibitor, and an anionic surfactant.

When a semiconductor device is cleaned using above-mentioned cleaning solutions, reducing corrosion of tungsten as well as decreasing etched amount of polysilicon may be limited. Alkaline cleaning solution for tungsten (W) as substituted for SC1 cleaning solution is currently being researched, whereas cleaning solutions for tungsten (W) or aluminum (Al) as substituted for SPA cleaning solution is known. Thus, there is a need for cleaning solutions that reduce corrosion of a metal layer and etched amount of a polysilicon layer of a semiconductor device having minute metal patterns as well as maintaining cleaning ability.

SUMMARY OF THE INVENTION

In one exemplary embodiment of the present invention, a cleaning composition comprises an alkali solution, pure water, and a surfactant represented by the following chemical formula: $R1\text{-}OSO_3\text{—}HA^+$ wherein R1 is one selected from a group consisting of a butyl group, an isobutyl group, an isooctyl group, a nonyl phenyl group, an octyl phenyl group, a decyl group, a tridecyl group, a lauryl group, a myristyl group, a cetyl group, a stearyl group, an oleyl group, a licenoleyl group and a behnyl group, and A is one selected from a group consisting of ammonia, ethanol amine, diethanol amine and triethanol amine.

In another exemplary embodiment of the present invention, a cleaning composition comprises an alkali solution, a metal corrosion inhibitor, pure water and a surfactant represented by the following chemical formula: $R1\text{-}OSO_3\text{—}HA^+$ wherein R1 is one selected from a group consisting of a butyl group, an isobutyl group, an isooctyl group, a nonyl phenyl group, an octyl phenyl group, a decyl group, a tridecyl group, a lauryl group, a myristyl group, a cetyl group, a stearyl group, an oleyl group, a licenoleyl group and a behnyl group, and A is one selected from a group consisting of ammonia, ethanol amine, diethanol amine and triethanol amine.

In still another exemplary embodiment of the present invention, a method of cleaning a semiconductor device comprises forming a structure including a polysilicon layer on a substrate, and cleaning the substrate having the structure using a cleaning composition comprising an alkali solution, pure water and a surfactant represented by the following chemical formula: $R1\text{-}OSO_3\text{—}HA^+$ wherein R1 is one selected from a group consisting of a butyl group, an isobutyl group, an isooctyl group, a nonyl phenyl group, an octyl phenyl group, a decyl group, a tridecyl group, a lauryl group, a myristyl group, a cetyl group, a stearyl group, an oleyl group, a licenoleyl group and a behnyl group, and A is one selected from a group consisting of ammonia, ethanol amine, diethanol amine and triethanol amine.

These and other exemplary embodiments, aspects, features and advantages of the present invention will become apparent from the following detailed description of exemplary embodiments, which is to be read in connection with the accompanying drawings.

BRIEF DESCRIPTION OF THE DRAWINGS

FIG. 3 is a graph illustrating an etched amount of a polysilicon layer relative to a concentration of a surfactant according to an exemplary embodiment of the present invention.

FIG. 4 is a graph illustrating an etched amount of a polysilicon layer relative to a kind of a surfactant according to an exemplary embodiment of the present invention.

DETAILED DESCRIPTION OF EXEMPLARY EMBODIMENTS

Figure 1:
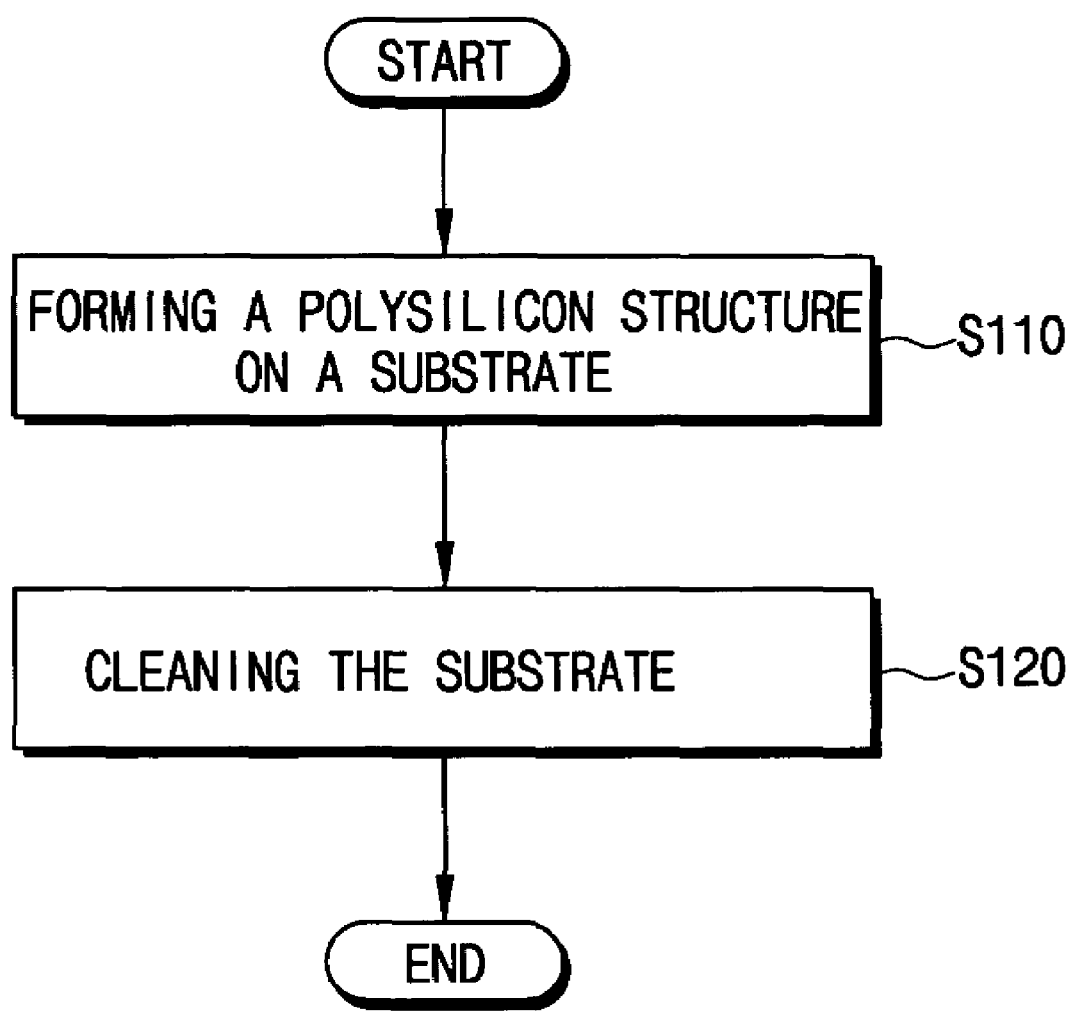
FIG. 1 is a flow chart illustrating a method of cleaning a semiconductor device according to an exemplary embodiment of the present invention.

Exemplary embodiments of the present invention will now be described more fully hereinafter below with reference to the accompanying drawings. This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art.

In one exemplary embodiment of the present invention, a cleaning composition includes a surfactant having anions that greatly reduce an etched amount of a polysilicon layer. The cleaning composition includes a surfactant represented by the following chemical formula:

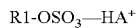

R1-OSO$_3$—HA$^+$

The surfactant may include an anionic surfactant that has a low foaming characteristic. For example, the surfactant includes an amine salt as a counter ion. R1 in the above chemical formula may be one selected from a group consisting of a butyl group, an isobutyl group, an isooctyl group, a nonyl phenyl group, an octyl phenyl group, a decyl group, a tridecyl group, a lauryl group, a myristyl group, a cetyl group, a stearyl group, an oleyl group, a licenoleyl group, and a behnyl group. A in the chemical formula may include one selected from a group consisting of ammonia, ethanol amine, diethanol amine, and triethanol amine.

R1 and A in the chemical formula control solubility of the surfactant, interface activity of the surfactant in the polysilicon aqueous solution and the etched amount of the polysilicon layer.

A cleaning composition according to an exemplary embodiment of the present invention may include about 0.02 to about 20 weight percent of the surfactant. Preferably, the cleaning composition includes about 0.1 to about 1 weight percent of the surfactant. When the cleaning composition includes less than about 0.02 weight percent of the surfactant, the etched amount of the polysilicon layer may be increased whereas etching uniformity of the polysilicon layer may be deteriorated. When the cleaning composition includes more than about 10 weight percent of the surfactant, the etched amount of the polysilicon layer may converge to a certain value without decreasing the etched amount of the polysilicon layer.

The cleaning composition may further include an alkali solution. Examples of the alkali solution may include an inorganic basic aqueous solution including sodium hydroxide, potassium hydroxide or ammonia. Alternatively, examples of the alkali solution may include an organic basic aqueous solution including tetra methyl ammonium hydroxide or tetra methyl ammonium chloride. The alkaline cleaning solution may effectively remove particles from the semiconductor device. For examples, the alkaline cleaning solution may effectively remove particles generated in a chemical mechanical polishing (CMP) process for forming a copper wiring or particles generated in a step for forming a gate line or a bit line using tungsten (W).

The cleaning composition may include about 0.0001 to about 10 weight percent of the alkali solution. In one exemplary embodiment of the present invention, the cleaning composition includes about 0.01 to about 5 weight percent of the alkali solution. When the cleaning composition includes less than 0.0001 weight percent of the alkali solution, the cleaning ability of the cleaning composition may be reduced. When the cleaning composition includes more than 10 weight percent of the alkali solution, a cleaning apparatus and metal elements of the cleaning device may be corroded.

The cleaning composition may further include pure water. The surfactant, the alkali solution and the pure water are mixed to prepare the cleaning composition.

The cleaning composition in exemplary embodiments of the present invention may have constant cleaning ability without generating etch damage to the polysilicon layer. Thus, a highly integrated semiconductor device may have improved reliability when the semiconductor device is cleaned using the cleaning composition.

In one exemplary embodiment of the present invention, a cleaning composition may reduce an etched amount of the polysilicon layer and corrosion of tungsten. The cleaning composition may further include a metal corrosion inhibitor together with an alkali solution, pure water and a surfactant in accordance with the chemical formula as described above. The metal corrosion inhibitor preferably includes a triple bond and at least one hydroxyl group. Examples of the metal corrosion inhibitor having the triple bond and hydroxyl group may include 2-butyne-1,4-diol, or 3-butyne-1-ol. Alternatively, thiol compound such as 2-mercaptoethanol or 1-mercapto2,3propandiol may be employed as the metal corrosion inhibitor.

The metal corrosion inhibitor may be added to the cleaning solution to prevent metal from corroding in a step for patterning a tungsten layer, a copper layer, or an alloy layer of tungsten and copper. The cleaning composition may include about 0.0001 to about 10 weight percent of the metal corrosion inhibitor. In one exemplary embodiment of the present invention, the cleaning composition may include about 0.001 to about 1 weight percent of the metal corrosion inhibitor. When the cleaning composition includes less than 0.0001 weight percent of the metal corrosion inhibitor, the corrosion inhibiting ability of the cleaning composition may be low. When the cleaning composition includes more than 10 weight percent of the metal corrosion inhibitor, the corrosion inhibiting ability of the cleaning composition converges to a certain value without increasing the corrosion inhibiting ability.

According to an exemplary embodiment of the present invention, a method of cleaning a semiconductor device uses the above-described cleaning compositions.

FIG. 1 is a flow chart illustrating a method of cleaning a semiconductor device in an exemplary embodiment of the present invention. Referring to FIG. 1, in step S10, a structure including a polysilicon layer is formed on a substrate. Subsequently, the substrate is cleaned using a cleaning solution including a surfactant, an alkali solution, and pure water in step S120. In one exemplary embodiment of the present invention, the surfactant includes an amine salt as a counter ion.

Figure 2A:
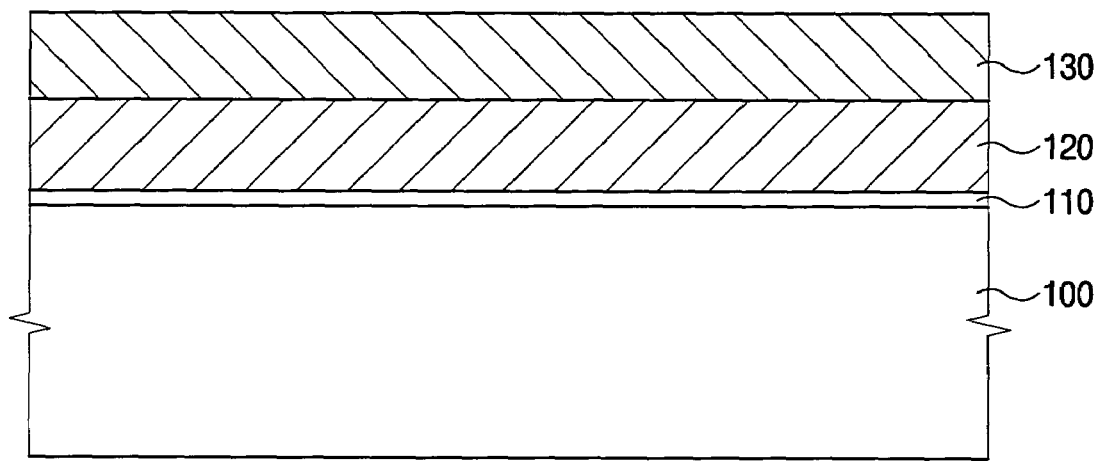
FIGS. 2A to 2C are cross-sectional schematic views of a semiconductor device illustrating a method of cleaning the semiconductor device according to an exemplary embodiment of the present invention.
Figure 2B:
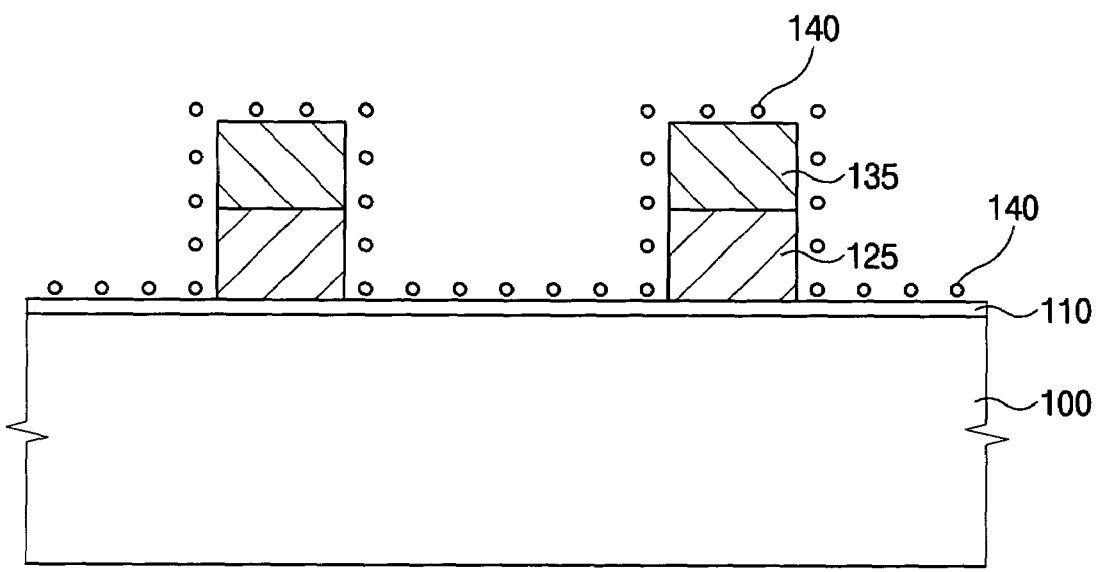
Figure 2C:
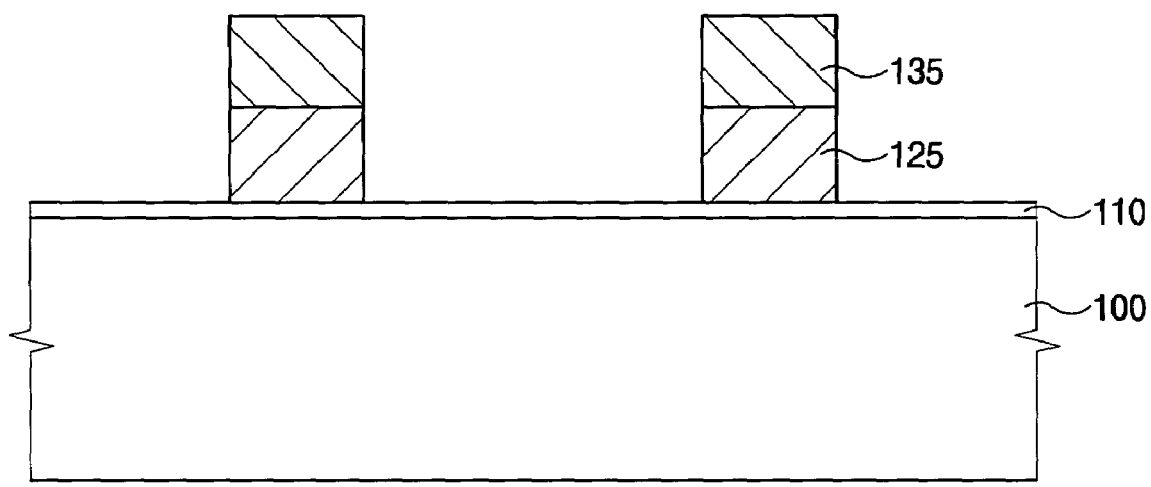

The method of cleaning a semiconductor device in an exemplary embodiment of the present invention now will be described hereinafter with reference to FIGS. 2A to 2C. FIGS. 2A to 2C are cross-sectional schematic views of a semiconductor device illustrating a method of cleaning the semiconductor device in an exemplary embodiment of the present invention.

Referring to FIGS. 2A and 2B, after an insulating layer 110 such as oxide layer is formed on a substrate 100, a polysilicon layer 120 is formed on the insulating layer 110. A metal layer 130 may be additionally formed on the substrate 100. In one exemplary embodiment of the present invention, the metal layer 130 may be formed on the polysilicon layer 120 to reduce electrical resistance so that performance of the semiconductor device may be improved. The metal layer 130 may include metal silicide or metal that generally does not react with silicon. The metal layer 130 may include metal having a good gap filling characteristic and a low resistivity. For example, tungsten (W), copper (Cu), titanium (Ti), or aluminum can be used.

Subsequently, in step S110, semiconductor device patterns including silicon structures 125 and metal structures 135 are formed on the insulating layer 110 by, for example, an etching process or a CMP process. Either the etching process or the CMP process may be selected in accordance with a kind of metal in the metal layer 130. The semiconductor device pattern including the silicon structure 125 and the metal structure 135 may be used as a gate line or a bit line of a transistor.

Contaminants such as particles 140 are generated in the step for forming the silicon structure 125 and the metal structure 135 so that a cleaning process for removing the particles is required.

Referring to FIG. 2C, contaminants such as particles 140 are removed from the semiconductor device patterns using a cleaning composition in step S120. When the semiconductor device pattern includes the polysilicon structure 125 and does not include the metal structure 135, the cleaning composition may include about 0.02 to about 10 weight percent of a surfactant in accordance with the chemical formula, about 0.0001 to about 10 weight percent of an alkali solution, and about 80 to about 99 weight percent of pure water.

When the cleaning composition includes less than about 0.02 weight percent of the surfactant, the etched amount of the polysilicon layer may be increased whereas etching uniformity of the polysilicon layer may be deteriorated. When the cleaning composition includes more than about 10 weight percent of the surfactant, the etched amount of the polysilicon layer may converge to a certain value without decreasing the etched amount of the polysilicon layer. R1 and A in the chemical formula controls solubility of the surfactant, interface activity of the surfactant in the polysilicon aqueous solution and the etched amount of the polysilicon layer.

The alkali solution may include an inorganic basic aqueous solution including sodium hydroxide, potassium hydroxide or ammonia. Alternatively, the alkali solution may include an organic basic aqueous solution including tetra methyl ammonium hydroxide or tetra methyl ammonium chloride. When the cleaning composition includes less than about 0.0001 weight percent of the alkali solution, the cleaning ability of the cleaning composition may be lowered. When the cleaning composition includes more than about 10 weight percent of the alkali solution, a cleaning apparatus and metal element of the cleaning device may be corroded.

When the semiconductor device pattern includes the metal structure 135 as well as the polysilicon structure 125, the cleaning composition may further include a metal corrosion inhibitor together with the surfactant, the alkali solution, and pure water. The metal corrosion inhibitor preferably includes a triple bond and at least one hydroxyl group. Examples of the metal corrosion inhibitor may include 2-butyne-1,4-diol or 3-butyne-1-ol. In another exemplary embodiment of the present invention, the metal corrosion inhibitor may include thiol compound such as 2-mercaptoethanol or 1-mercapto 2,3-propandiol.

The metal corrosion inhibitor may be added to the cleaning solution to prevent metal from corroding in a step for patterning the tungsten layer, copper layer, or alloy layer of tungsten and copper. The cleaning composition may include about 0.0001 to about 10 weight percent of the metal corrosion inhibitor. In one exemplary embodiment of the present invention, the cleaning composition may include about 0.001 to about 1 weight percent of the metal corrosion inhibitor. When the cleaning composition includes less than about 0.0001 weight percent of the metal corrosion inhibitor, the corrosion inhibiting ability of the cleaning composition may be reduced. When the cleaning composition includes more than about 10 weight percent of the metal corrosion inhibitor, the corrosion inhibiting ability of the cleaning composition converges to a certain value without increasing the corrosion inhibiting ability.

The cleaning composition in one exemplary embodiment of the present invention may decrease the etched amount of the polysilicon layer and corrosion of metal. Thus, a highly integrated semiconductor device having a high aspect ratio may be formed using the cleaning composition.

Exemplary embodiments of the present invention now will be described more fully hereinafter with reference to examples and comparative examples. Exemplary embodiments of the present invention should not be construed as limited to the examples set forth herein.

Preparing Cleaning Compositions

EXAMPLE 1

Ammonia solution (manufactured by Aldrich Chemical Co. in USA) and about 0.1 weight percent of ammonium lauryl sulfate referred to as ALS (manufactured by Wako Pure Chemical Co. in Japan) as an anionic surfactant were mixed at room temperature to prepare a cleaning composition. The ammonia solution included about 0.27 weight percent of ammonia.

EXAMPLE 2

A cleaning composition was prepared in accordance with Example 1 as described above except the cleaning composition included about 0.2 weight percent of ALS.

COMPARATIVE EXAMPLE 1

A cleaning composition was prepared in accordance with Example 1 as described above except the cleaning composition included about 0.01 weight percent of ALS.

COMPARATIVE EXAMPLE 2

Ammonia solution (manufactured by Aldrich Chemical Co. in USA) and about 0.01 weight percent of NCW1002 (trade name manufactured by Wako Pure Chemical Co. in Japan) as a nonionic surfactant were mixed at room temperature to prepare a cleaning composition. Here, the ammonia solution included about 0.27 weight percent of ammonia.

COMPARATIVE EXAMPLES 3 AND 4

Cleaning compositions were prepared in accordance with Comparative Example 2 as described above except the cleaning composition included about 0.1 and about 0.2 weight percent of NCW1002, respectively.

COMPARATIVE EXAMPLES 5 AND 6

Cleaning compositions were prepared in accordance with Example 1 as described above except the cleaning composition included nonyl phenol referred to as NP (manufactured by IC Chem Co. Ltd in Korea) in substitute for ALS. For example, NP15 was used in Comparative Example 5 and NP50 was used in Comparative Example 6.

COMPARATIVE EXAMPLES 7 TO 10

Cleaning compositions were prepared in accordance with Example 1 as described above except the cleaning composition included lauryl alcohol referred to as LA (manufactured by IC Chem Co. Ltd in Korea) in substitute for ALS. For example, LA10, LA15, LA25 and LA50 were used in Comparative Examples 7 to 10, respectively.

COMPARATIVE EXAMPLES 11 AND 12

Cleaning compositions were prepared in accordance with Example 1 as described above except the cleaning composition included tridecyl alcohol referred to as TDA (manufactured by IC Chem Co. Ltd in Korea) in substitute for ALS. For example, TDA10 and TDA14 were used in Comparative Examples 11 and 12, respectively.

COMPARATIVE EXAMPLES 13 TO 17

Cleaning compositions were prepared in accordance with Example 1 as described above except the kind of the surfactant used in Comparative examples in substitute for ALS. For example, oleyl alcohol referred to as OA (manufactured by IC Chem Co. Ltd in Korea) was used in Comparative Example 13. Stearyl alcohol referred to as SA (manufactured by IC Chem Co. Ltd in Korea) was used in Comparative Example 14. Lauryl amine referred to as LM (manufactured by IC Chem Co. Ltd in Korea) was used in Comparative Example 15. SURF-001 (trade name manufactured by Wako Pure Chemical Co. in Japan) as an anionic surfactant was used in Comparative Example 16. Cetyl trimethyl ammonium bromide referred to as CTAB (manufactured by Aldrich Chemical Co. Ltd in USA) as a cationic surfactant was used in Comparative Example 17.

The surfactants used in Comparative Examples 2 to 15 were nonionic surfactants. The kind and the concentration of the surfactant used in Examples 1 and 2, and Comparative Examples 1 to 17 are given in the following Table 1. The numbers in the names of the surfactants used in Comparative Examples 5 to 12 represent a unit mole number of ethylene oxide.

TABLE 1

|  | Surfactant | Concentration (wt %) |
|---|---|---|
| Example 1 | ALS | 0.1 |
| Example 2 | ALS | 0.2 |
| Comparative Example 1 | ALS | 0.01 |
| Comparative Example 2 | NCW1002 | 0.01 |
| Comparative Example 3 | NCW1002 | 0.1 |
| Comparative Example 4 | NCW1002 | 0.2 |
| Comparative Example 5 | NP15 | 0.1 |
| Comparative Example 6 | NP50 | 0.1 |
| Comparative Example 7 | LA10 | 0.1 |
| Comparative Example 8 | LA15 | 0.1 |
| Comparative Example 9 | LA25 | 0.1 |
| Comparative Example 10 | LA50 | 0.1 |
| Comparative Example 11 | TDA10 | 0.1 |
| Comparative Example 12 | TDA14 | 0.1 |
| Comparative Example 13 | OA | 0.1 |
| Comparative Example 14 | SA | 0.1 |
| Comparative Example 15 | LM | 0.1 |
| Comparative Example 16 | SURF-001 | 0.1 |
| Comparative Example 17 | CTAB | 0.1 |

Variation of an Etched Amount of a Polysilicon Layer Relative to Concentration of a Surfactant An oxide layer as an insulating layer having an average thickness of about 1000 Å was formed on a silicon substrate. Then, a polysilicon layer having an average thickness of about 800 Å was formed on the oxide layer. A native oxide layer formed on the polysilicon layer was removed from the polysilicon layer using hydrofluoric acid (wherein, a dilution ratio of hydrofluoric acid relative to water is about 1:100) to prepare a substrate having a polysilicon layer. The substrate was treated with the cleaning solution prepared in Example 1 for about 10 minutes at about 65° C. Then an etched amount of the polysilicon layer was measured. A result is given in the following Table 2 and FIG. 3.

After substrates having a polysilicon layer were formed according to the same method as described above, the substrates were treated with the cleaning solutions prepared in Example 2 and Comparative Examples 1 to 4 for about 10 minutes at about 65° C. Then, etched amounts of the polysilicon layers were measured, and the results are given in the following Table 2 and FIG. 3.

TABLE 2

|  | etched amount of polysilicon layer (Å) |
|---|---|
| Example 1 | 22.2 |
| Example 2 | 18.2 |
| Comparative Example 1 | 148.6 |
| Comparative Example 2 | 61.0 |
| Comparative Example 3 | 51.6 |
| Comparative Example 4 | 53.3 |

As shown in Table 2 and FIG. 3, when the substrate was treated with the cleaning composition prepared in Example 1 or 2, the etched amount of the polysilicon layer was decreased by about 50%.

Variation of an Etched Amount of a Polysilicon Layer Relative to a Kind of a Surfactant An oxide layer as an insulating layer having an average thickness of about 1000 Å was formed on a silicon substrate. A polysilicon layer having an average thickness of about 800 Å was formed on the oxide layer. A native oxide layer formed on the polysilicon layer was removed from the polysilicon layer using hydrofluoric acid (wherein, a dilution ratio of hydrofluoric acid relative to water is about 1:100) to prepare a substrate having a polysilicon layer. The substrate was treated with the cleaning solution prepared in Example 1 for about 10 minutes at about 65° C. Then an etched amount of the polysilicon layer was measured. A result is given in the following Table 3 and FIG. 4.

After substrates having a polysilicon layer were formed according to the same method as described above, the substrates were treated with the cleaning solutions prepared in Comparative Examples 3, 5 to 17 for about 10 minutes at about 65° C., respectively. Then, etched amounts of the polysilicon layers were measured. Results are given in the following Table 3 and FIG. 4.

TABLE 3

|  | etched amount of polysilicon layer (Å) |
|---|---|
| Example 1 | 23.3 |
| Comparative Example 3 | 50 |
| Comparative Example 5 | 50.1 |
| Comparative Example 6 | 62.1 |
| Comparative Example 7 | 54.4 |
| Comparative Example 8 | 50.3 |
| Comparative Example 9 | 49.3 |
| Comparative Example 10 | 60.0 |
| Comparative Example 11 | 49.1 |
| Comparative Example 12 | 46.9 |
| Comparative Example 13 | 66.8 |
| Comparative Example 14 | 67.7 |
| Comparative Example 15 | 63.3 |
| Comparative Example 16 | 33.0 |
| Comparative Example 17 | 800.0 |

As shown in Table 3 and FIG. 4, when the substrate was treated with the cleaning composition prepared in Comparative Example 17, the polysilicon layer was completely removed. When the substrate was treated with the cleaning composition prepared in Example 1, the etched amount of the polysilicon layer had a minimum value of about 23.3 Å.

The cleaning composition in an exemplary embodiment of the present invention may reduce the etched amount of the polysilicon layer without damaging the metal structure. Further, the cleaning composition may prevent patterns from being damaged in a step for cleaning a semiconductor device having a high aspect ratio.

Thus, a highly integrated semiconductor device having improved reliability may be economically manufactured when the semiconductor device is cleaned using the cleaning composition. Time and cost required for the manufacturing a semiconductor device may be reduced.

Although exemplary embodiments have been described herein with reference to the accompanying drawings, it is to be understood that the present invention is not limited to such exemplary embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A cleaning composition comprising:
   an alkali solution;
   a metal corrosion inhibitor comprising at least one selected from the group consisting of 2-butyne-1,4-diol and 3-butyne-1-ol;
   pure water; and
   a surfactant represented by the following chemical formula: $R1\text{-}OSO_3\text{-}HA^+$
   wherein R1 is one selected from the group consisting of a butyl group, an isobutyl group, an isooctyl group, a nonyl phenyl group, an octyl phenyl group, a decyl group, a tridecyl group, a lauryl group, a myristyl group, a cetyl group, a stearyl group, an oleyl group, a licenoleyl group and a behnyl group, and A is one selected from the group consisting of ammonia, ethanol amine, diethanol amine and triethanol amine.

2. The cleaning composition of claim 1, comprising:
   about 0.02 to about 10 weight percent of the surfactant;
   about 0.0001 to about 10 weight percent of the metal corrosion inhibitor;
   about 0.0001 to about 10 weight percent of the alkali solution; and
   about 70 to about 99 weight percent of the pure water.

3. The cleaning composition of claim 1, comprising:
   about 0.1 to about 1 weight percent of the surfactant;
   about 0.00 1 to about 1 weight percent of the metal corrosion inhibitor;
   about 0.01 to about 5 weight percent of the alkali solution; and
   about 93 to about 99 weight percent of the pure water.

4. The composition of claim 1, wherein the metal corrosion inhibitor further comprises a compound having a triple bond and at least one hydroxyl group.

5. The composition of claim 1, wherein the metal corrosion inhibitor further comprises at least one selected from the group consisting of 2-mercaptoethanol and 1-mercapto 2,3-propandiol.

6. A method of cleaning a semiconductor device comprising:
   forming a structure including a polysilicon layer on a substrate; and
   cleaning the substrate having the structure using a cleaning composition comprising an alkali solution, a metal corrosion inhibitor comprising at least one selected from the group consisting of 2-butyne-1,4-diol and 3-butyne-1-ol, pure water and a surfactant represented by the following chemical formula:

$$R1\text{-}OSO_3\text{---}HA^+$$ 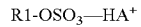

wherein R1 is one selected from the group consisting of a butyl group, an isobutyl group, an isooctyl group, a nonyl phenyl group, an octyl phenyl group, a decyl group, a tridecyl group, a lauryl group, a myristyl group, a cetyl group, a stearyl group, an oleyl group, a licenoleyl group and a behnyl group, and A is one selected from the group consisting of ammonia, ethanol amine, diethanol amine and triethanol amine, and
   wherein the cleaning composition suppresses an etching of the polysilicon layer while cleaning the substrate.

7. The method of claim 6, wherein the structure including the polysilicon layer comprises at least one selected from the group consisting of a gate line, a bit line and a pad.

8. The method of claim 6, wherein the structure further comprises a metal structure formed on the structure including the polysilicon layer.

9. The method of claim 8, wherein the metal structure further comprises a metal silicide layer formed on the structure including the polysilicon layer.

10. The method of claim 6, wherein the cleaning composition comprises:
- about 0.02 to about 10 weight percent of the surfactant;
- about 0.000 1 to about 10 weight percent of the metal corrosion inhibitor;
- about 0.0001 to about 10 weight percent of the alkali solution; and
- about 70 to about 99 weight percent of the pure water.

11. The method of claim 8, wherein the metal structure comprises at least one selected from the group consisting of tungsten (W), copper (Cu), and titanium (Ti).

12. The cleaning composition of claim 1, wherein the alkali solution comprises at least one selected from the group consisting of sodium hydroxide, potassium hydroxide, ammonia, tetramethylammonium hydroxide and tetramethylammonium chloride.

* * * * *